United States Patent
Wenzel et al.

(10) Patent No.: US 7,674,656 B2
(45) Date of Patent: Mar. 9, 2010

(54) DIE POSITIONING FOR PACKAGED INTEGRATED CIRCUITS

(75) Inventors: Robert J. Wenzel, Austin, TX (US); Matthew A. Ruston, Austin, TX (US); David M. Wells, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 507 days.

(21) Appl. No.: 11/567,249

(22) Filed: Dec. 6, 2006

(65) Prior Publication Data
US 2008/0138938 A1   Jun. 12, 2008

(51) Int. Cl.
*H01L 21/00* (2006.01)
*H01L 23/02* (2006.01)

(52) U.S. Cl. .................... 438/127; 257/678
(58) Field of Classification Search ......... 438/106–127, 438/12; 257/678; 264/272.15
See application file for complete search history.

(56) References Cited

U.S. PATENT DOCUMENTS

| | | | | |
|---|---|---|---|---|
| 5,336,639 A | * | 8/1994 | Nagaraj et al. | 29/827 |
| 5,863,805 A | * | 1/1999 | Chiang | 438/123 |
| 6,921,975 B2 | * | 7/2005 | Leal et al. | 257/723 |

FOREIGN PATENT DOCUMENTS

JP        56148839 A   * 11/1981
JP        07240426 A   *  9/1995

OTHER PUBLICATIONS

Owen R. Fay, Lizabeth Ann Keser, George R. Leal, and Robert J. Wenzel; U.S. Appl. No. 11/373,541, filed Mar. 10, 2006, titled "Perforated Embedded Plane Package and Method".
William H. Lytle, Scott M. Hayes, and George R. Leal, U.S. Appl. No. 11/372,666, filed Mar. 10, 2006, titled "Warp Compensated Package and Method".

* cited by examiner

*Primary Examiner*—Kiesha L. Rose
*Assistant Examiner*—John Doyle
(74) *Attorney, Agent, or Firm*—David G. Dolezal; James L. Clingan, Jr.

(57) ABSTRACT

A method that locates a plurality of die for forming a plurality of packaged integrated circuits. A frame is placed over the support structure, wherein the frame includes a plurality of openings therein and each opening of the plurality of openings has at least two walls. Each die of a plurality of die is placed over the support structure, wherein each die has at least two adjacent edges. The relative placing of the frame and the die results in each die being in an opening of the plurality of openings. Encapsulant is applied to the plurality of die. Either or both of the plurality of die and frame are moved in relation to the other in a manner that causes the two adjacent edges of each die of the plurality of die to substantially abut to and align with the two walls of an opening of the plurality of openings.

23 Claims, 8 Drawing Sheets

DIE POSITIONING FOR PACKAGED INTEGRATED CIRCUITS

BACKGROUND

1. Field of the Invention

This invention relates in general to semiconductor devices and more specifically to packaging semiconductor devices.

2. Description of the Related Art

Integrated circuit dies may be implemented in packaged integrated circuits for the protection of the die. In some examples, integrated circuit die or dies are placed on one side of a substrate with conductive interconnecting structures that electrically couple the die bond pads to external conductors (e.g. bond pads, solder balls) on the other side of the substrate.

In other examples, multiple singulated die may be encapsulated in a group package where the bond pads of the die are exposed on one side of the group package. An interconnect layer including conductive vias, interconnects, and interlayer dielectric material may be subsequently formed on the side of the exposed die pads wherein external conductors (e.g. balls, pads) may be formed on top of the interconnects, with the external conductors electrically coupled to the die bond pads. The resultant structure is then singulated into separated packaged integrated circuits.

One problem with the above technique is that locating the die accurately with the group package may be difficult due to encapsulant flow, cure shrinkage, and accuracy of the placement equipment. Inaccuracies in the die placement within the encapsulant make subsequent formation of the overlying interconnects difficult and may reduce yield.

What is needed is an improved technique for packaged integrated circuit formation.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Disclosed herein is a process for manufacturing a packaged integrated circuit wherein an integrated circuit die is aligned with a frame structure. During the process, the relationship between the die and the frame is changed such that the die substantially abuts to and aligns with two adjacent sides of an opening of the frame.

Figure 1:
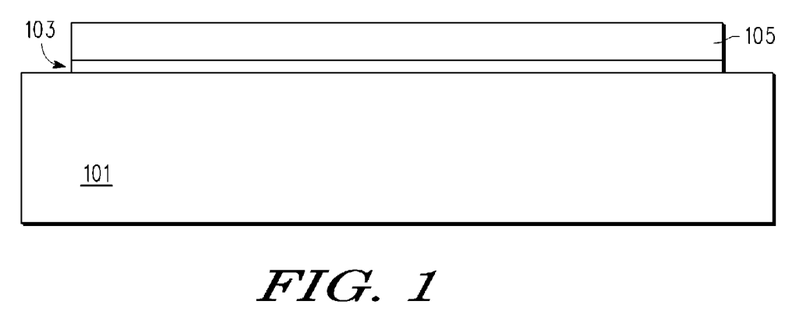
FIG. 1 is a side view of structures utilized in forming a plurality of packaged integrated circuits during one stage of manufacture according to one embodiment of the present invention.

FIG. 1 is a side view of a carrier 101 onto which integrated circuit dies will subsequently be placed for forming a plurality of packaged integrated circuits. A frame 105 is secured to carrier 101 by an adhesive structure. In one embodiment, frame 105 is made of a conductive material (e.g. copper, gold, aluminum). In some embodiments, frame 105 may serve as a ground plane or shield in subsequently formed integrated circuit packages. In other embodiments, frame 105 may be made of dielectric materials.

Frame 105 is secured to carrier 101 with an adhesive structure 103. In one embodiment, adhesive structure 103 includes a tape with adhesive material. In one embodiment, the tape may include double sided adhesive. In other embodiments, the adhesive structure 103 would be a spray on adhesive material. In some embodiments, the adhesive material is of a thermal, chemical, or ultraviolet (UV) release material.

Figure 2:
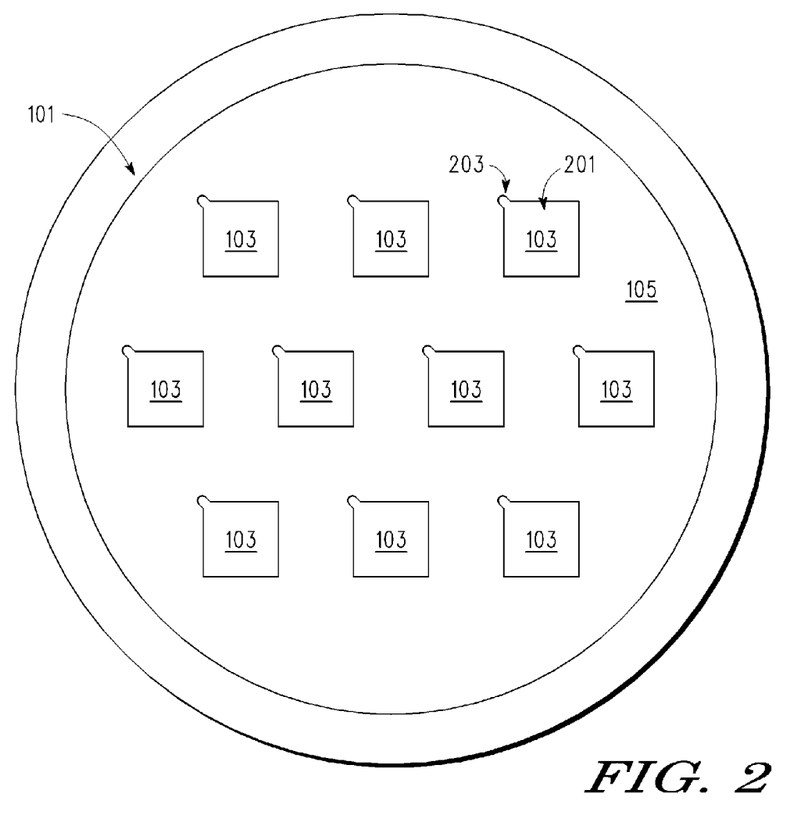
FIG. 2 is a top view of structures utilized in forming a plurality of packaged integrated circuits during one stage of manufacture according to one embodiment of the present invention.

FIG. 2 is a top view of the structures of FIG. 1. In the embodiment of FIG. 1, frame 105 is a circular plate that does not completely cover carrier 101. In the embodiment shown, frame 105 is a solid plate with a plurality of openings 201 for die to be subsequently inserted into. In other embodiments, frame 105 may have other configurations such having other openings (not shown) so as to reduce the amount of material of the frame. In some of these embodiments, no die would be subsequently inserted into some of the openings. In the embodiment shown, each opening 201 is shaped as a rectangle with a relief aperture 203 located in one corner of the opening.

Figure 3:
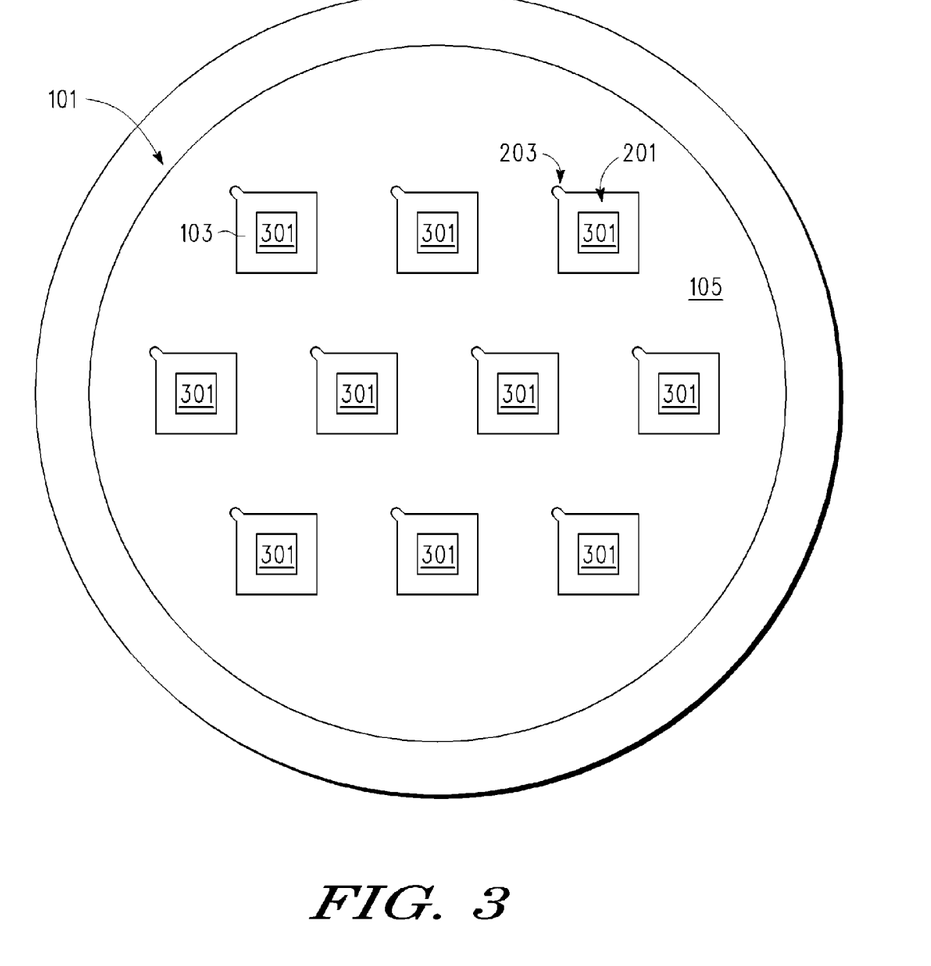
FIG. 3 is a top view of structures utilized in forming a plurality of packaged integrated circuits during one stage of manufacture according to one embodiment of the present invention.

FIG. 3 shows a top view after an integrated circuit die 301 is inserted in each opening 201 of frame 105. The die is place with its external conductive structure (e.g. bond pads) facing the carrier 101 and is adhered to carrier 101 by adhesive structure 103. The die 301 are placed generally in the middle of each opening 201 e.g. with a die pick and place apparatus. In other embodiments, the die are first placed on structure 103 and the frame is subsequently placed on structure 103.

Die 301 are formed from processing a wafer (not shown) as per conventional semiconductor processes. The wafer is subsequently singulated (e.g. with a saw) into individual die.

Figure 4:
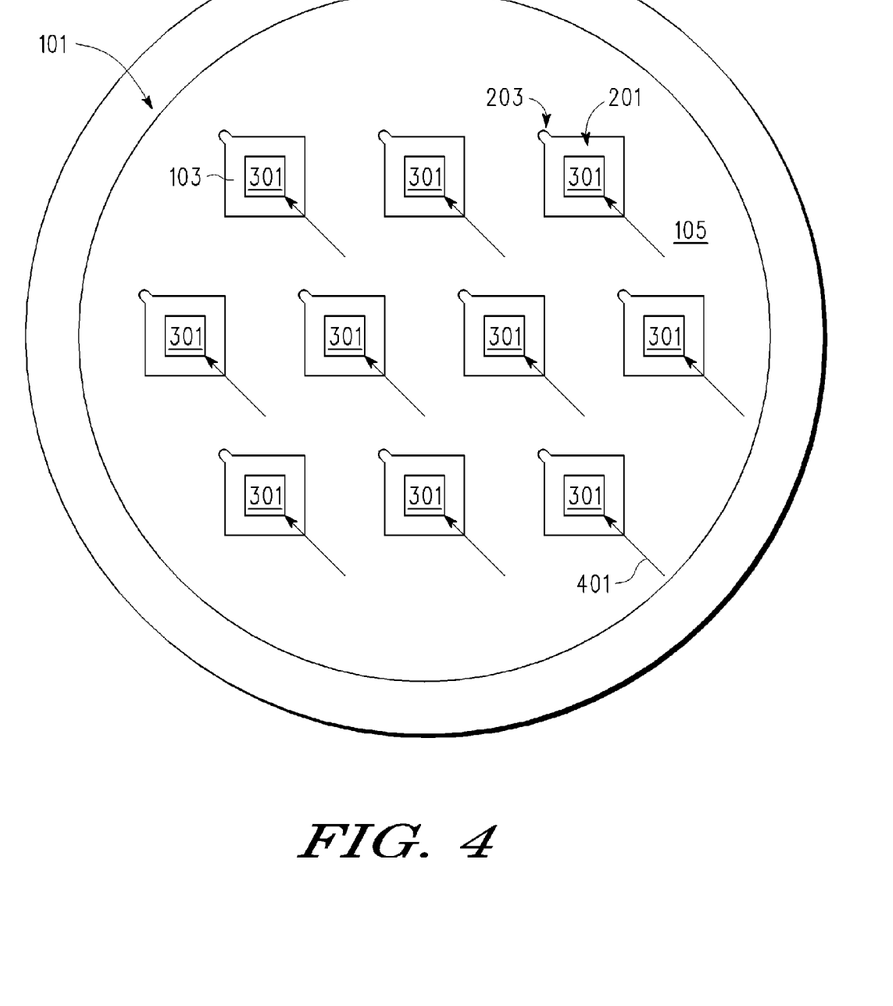
FIG. 4 is a top view of structures utilized in forming a plurality of packaged integrated circuits during one stage of manufacture according to one embodiment of the present invention.

In the embodiment of FIG. 4, a force 401 is applied to die 301 to move the die in a diagonal direction (relative to the view shown in FIG. 4) with respect to frame 105 such that each die 301 is positioned in a corner of an opening 201. In the embodiment shown, the force is applied on the die to move all of the die in a uniform direction (e.g. to the upper left hand corner, relative to the view shown in FIG. 1).

In one embodiment, the force for moving each die would be provided during the application of an encapsulant. In other embodiments, the die would be moved prior to the application of the encapsulant.

Figure 5:
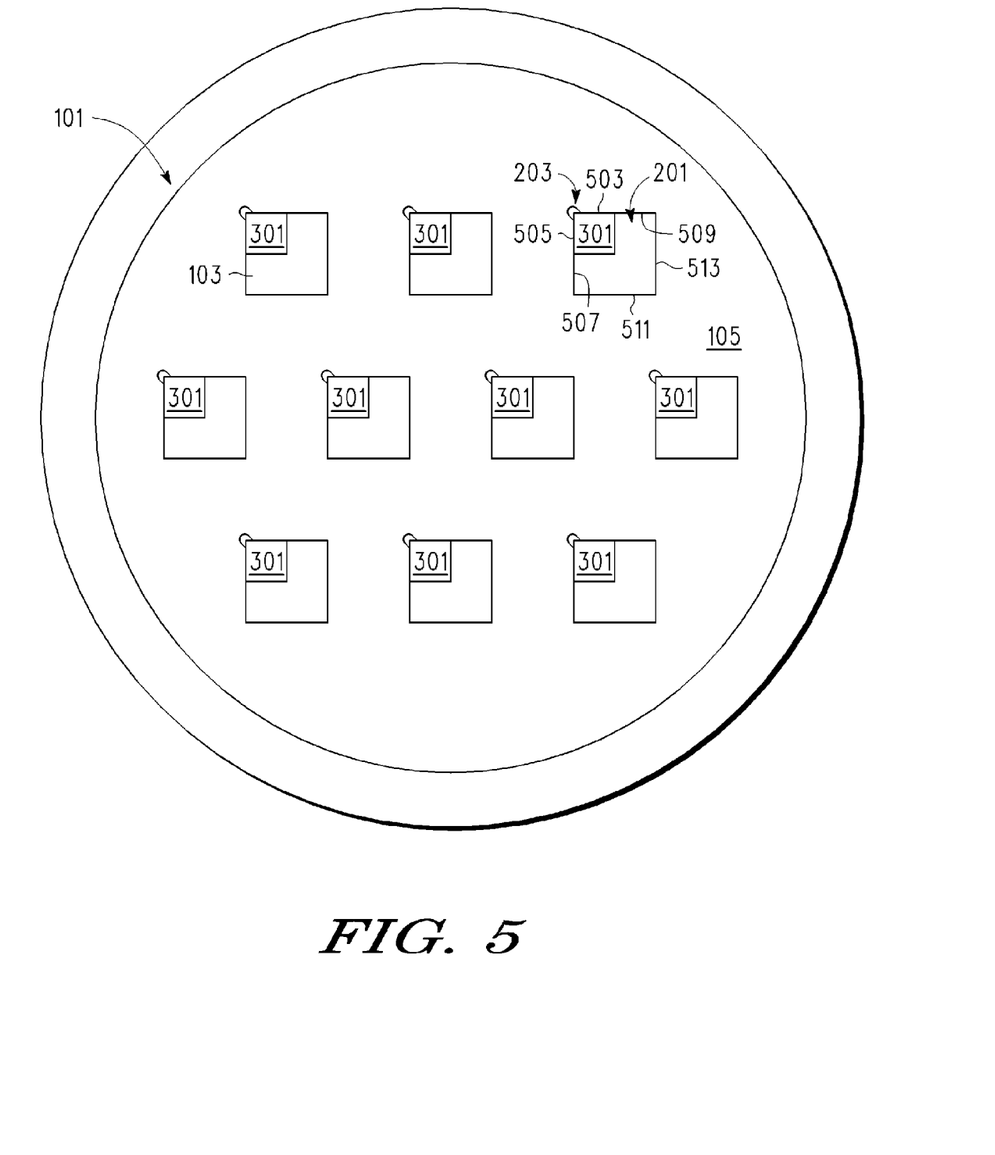
FIG. 5 is a top view of structures utilized in forming a plurality of packaged integrated circuits during one stage of manufacture according to one embodiment of the present invention.

FIG. 5 shows a top view after each die 301 have been move to a corner of the openings of frame 105. In this position, each die includes two adjacent major edges 505 and 503 that substantially abut and align with corresponding adjacent major walls 507 and 509 respectively of opening 201. In the embodiment shown, walls 507 and 509 are orthogonal to each other. In one embodiment, the entire portions of edges 505 and 503 are in contact with walls 507 and 509 respectively. However in other embodiments where the die edges 505 and 503 are substantially aligned and abutted, walls 507 and 509 may be in close proximity (as opposed to die's 301 proximately to walls 513 and 511) where vertical and horizontal angles of the cut of edges 505 and 503 as well as other considerations, may prevent contact of those edges with walls 509 and 507 of openings 201. In the embodiment shown, adjacent major edges 505 and 503 intersect each other. In other embodiments, a non major edge may be located between major adjacent edges 505 and 503.

In the embodiment of FIGS. 4 and 5, each die shown is moved to be positioned in the same corner (e.g. the upper left corner, relative to the view shown in FIG. 5) of its respective opening 201 of frame 105. The die 301 are positioned in the corner of the opening 201 that includes the relief aperture 203. The relief aperture in the embodiment shown is a rounded cutout that allows the corner of the die to fit in the aperture. Without the aperture, die 301 may be restrained from a good fit because the corner of the opening 201 may be rounded such that the die edges 505 and 503 could not contact the sides of opening 201. In other embodiments, aperture 203 may be of other shapes (e.g. square, rectangle, oval).

In some embodiments, the movement of die 301 from their positions shown in FIG. 3 to their positions shown in FIG. 5 may be accomplished by the application of an encapsulant. In one embodiment, to move all of the die 301 located over a carrier 101 in the same direction, the encapsulant would be applied to the structures in the general direction of force 401 of FIG. 4.

In the embodiment shown, the movement of the die with respect to the frame is in a direction towards the intersecting point of the angle formed by the surfaces of walls 507 and 509.

Figure 6:
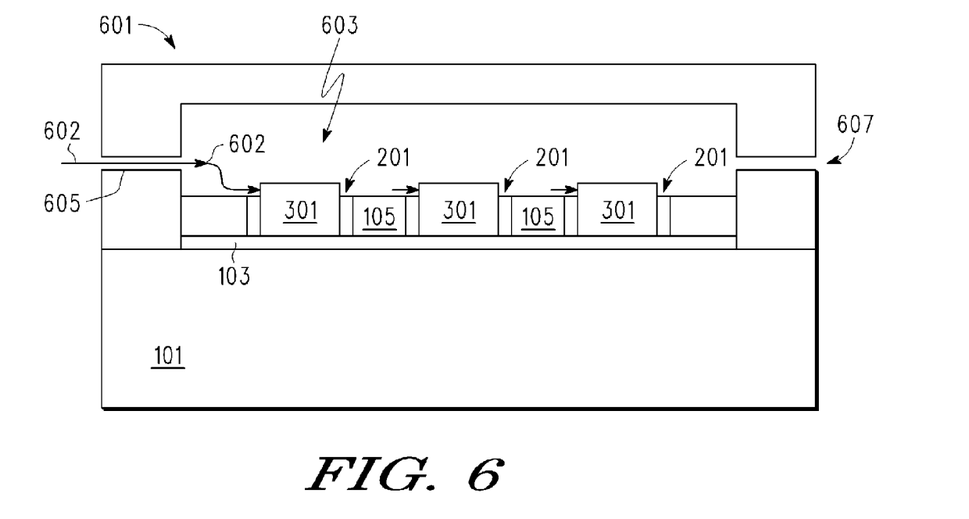
FIG. 6 is a side view of structures utilized in forming a plurality of packaged integrated circuits during one stage of manufacture according to one embodiment of the present invention.

FIG. 6 shows one embodiment of applying encapsulant directionally to move the die by a transfer molding encapsulation process. In the embodiment shown, a mold cavity fixture 601 is secured (e.g. clamped) to carrier 101. The clamping of fixture 601 to carrier 101 forms an encapsulant cavity above die 301 and frame 105 wherein encapsulant is to be injected. Fixture 601 includes a plurality of inlets 605 in the side (with one hole being shown in FIG. 6) for directionally injecting encapsulant 602 into cavity 603 in the general direction it is desired to move die 301 with respect to frame 105.

During the injection process, heat is applied to the structure shown in FIG. 1. At elevated temperatures (e.g. 160-190 C, 175 C nominal), the adhesive material of adhesive structure 103 becomes flowable thereby allowing die 301 to move more easily in the desired direction from the flow of the encapsulant. Fixture 607 also includes vent outlet for the outsourcing of gasses and material during the encapsulating process.

In one embodiment, fixture 601 includes a plurality of inlets 605 located around generally half of the fixture. In one embodiment, the inlets are parallelly positioned in the general direction of desired movement (e.g. the direction of force 401 in FIG. 4). The amount of material supplied through each inlet may be varied depending upon the amount of frame 105 that the direction of the outlet transverses. For example, more material would be applied to a middle inlet than a peripheral inlet.

In one embodiment, encapsulant 602 has a viscosity such that it will move within cavity 603 and yet have enough viscosity at those temperatures (e.g. 175 C) to apply a force for moving die 301. In one embodiment, encapsulant 602 is an epoxy molding compound.

Figure 7:
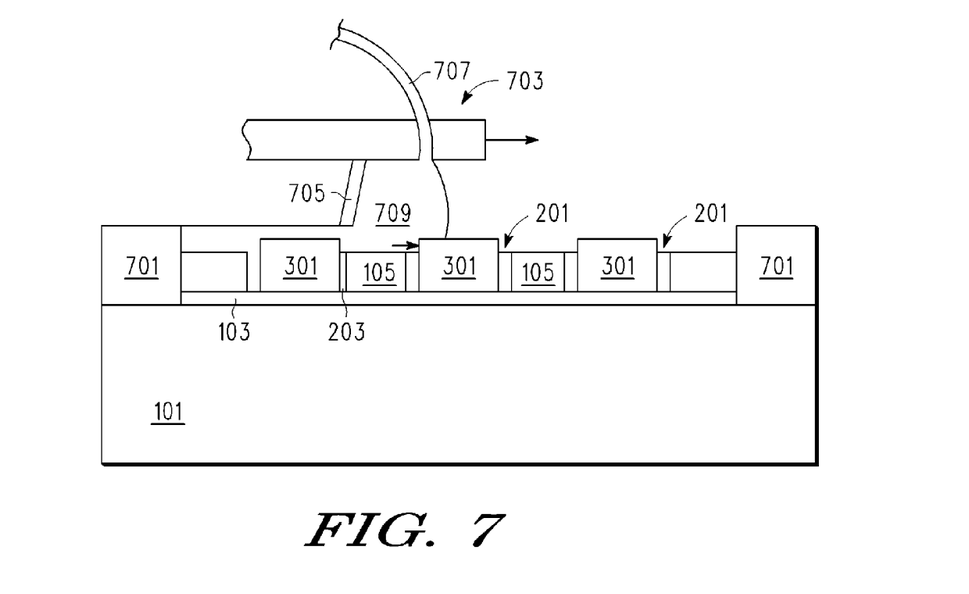
FIG. 7 is a side view of structures utilized in forming a plurality of packaged integrated circuits during one stage of manufacture according to another embodiment of the present invention.

FIG. 7 shows another process for moving the die during an encapsulating application process. In the embodiment of FIG. 7, the encapsulant is applied in a screen printing process. A screen print encapsulating device 703 includes a mold injecting path 707 for proving encapsulating material 709 over carrier 101 and a squeegee structure 705 for leveling out encapsulating material 709. During the encapsulant application process, device 703 moves in a first direction (left to right in the view of FIG. 7) which, in the embodiment shown, is the direction of desired movement of die 301 with respect to the frame 105. As shown in FIG. 7, the application of the encapsulating material 709 and the movement of device 703 including squeegee structure 705 causes die 301 to move in the desired direction. After device 703 has moved across carrier 101, all of die 301 would be positioned in the desired corners of the openings 201 where die 301 is positioned during encapsulant curing.

Figure 8:
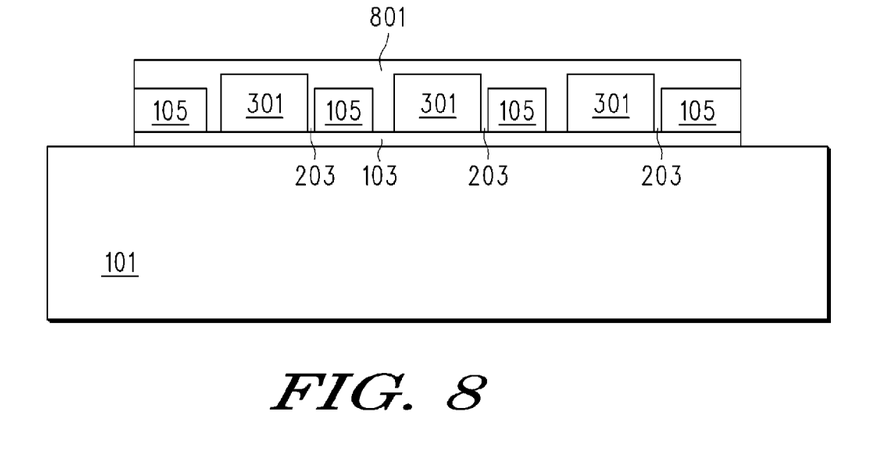
FIG. 8 is a side view of structures utilized in forming a plurality of packaged integrated circuits during one stage of manufacture according to one embodiment of the present invention.

FIG. 8, shows a side view after encapsulation with all encapsulating fixtures and other equipment being removed. In the embodiment shown, die 301 is encapsulated in an encapsulant 801 (e.g. epoxy molding compound) that has been hardened by a material dependent curing process (e.g. 90 seconds at 175 C mold cure and 4 hours at 175 C oven cure). In the side view of FIG. 8, the space between the right edge of die 301 and frame 105 are shown as separated due to the space of relief aperture 203. However, other portions of the right edge of die 301 would be contacting a side wall of frame 105.

Figure 9:
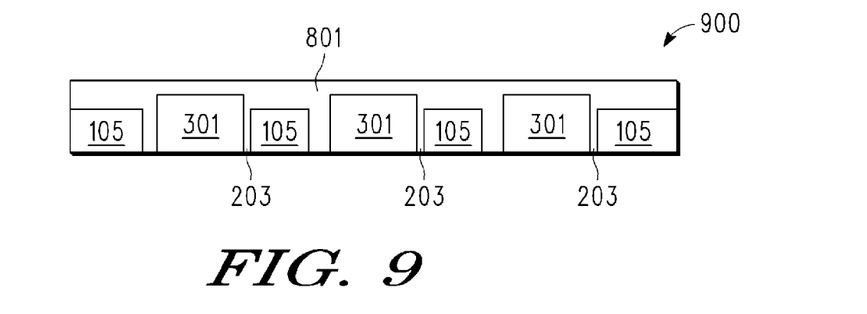
FIG. 9 is a side view of structures utilized in forming a plurality of packaged integrated circuits during one stage of manufacture according to one embodiment of the present invention.

Referring to FIG. 9, carrier 101 and adhesive structure 103 are removed from the encapsulated structure 900. In one embodiment, carrier 101 is of a porous ceramic material. In this embodiment, the carrier can be placed in a fluid that includes a chemical that dissolves the adhesive material to release the encapsulated structure from carrier 101. In other embodiments, carrier 101 may be released from encapsulated structure 900 by heating the structure of a temperature such that the adhesive material breaks down. In other embodiments, carrier 101 may be of a transparent or translucent material such that ultra violet light may be used to break down the adhesive material.

Figure 10:
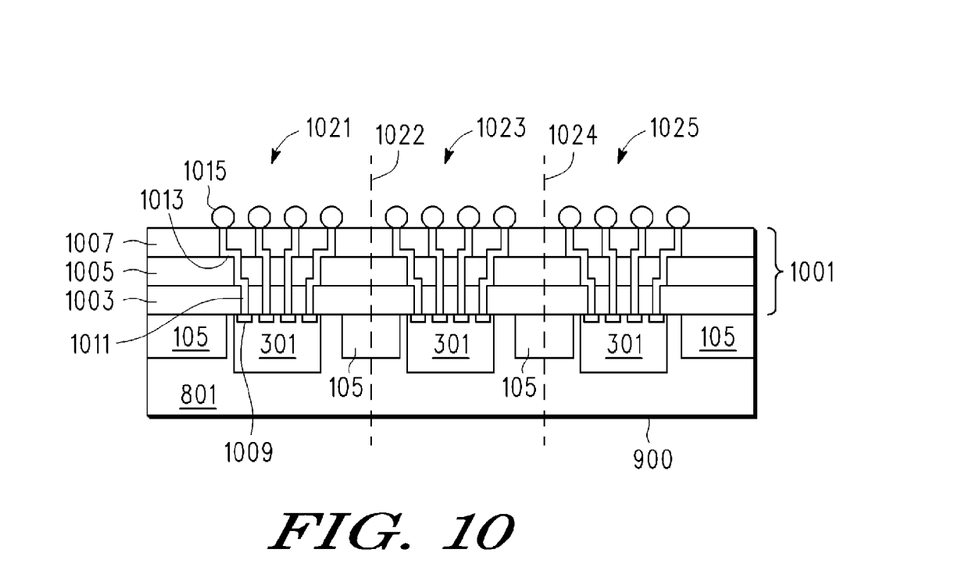
FIG. 10 is a side view of structures utilized in forming a plurality of packaged integrated circuits during one stage of manufacture according to one embodiment of the present invention.

Referring to FIG. 10, after the carrier 101 has been released, encapsulated structure 900 is inverted such the bond pads 1009 of die 301 are facing up ward. Afterwards, interconnect layer 1001 is formed over encapsulated structure 900. Interconnect layer 1001 includes a plurality of dielectric layers with conductive interconnects (e.g. 1013) and vias (e.g. 1011) located therein to couple the bond pads (1009) of die 301 to solder balls (1015) located on the top surface of interconnect layer 1001. In other embodiments, other types of external conductors (e.g. bond pads, leads) may be used in place of balls 1015. Interconnect layer 1001 may include other structures (e.g. barrier layers, passivation layers) not shown in FIG. 10. In some embodiments, portions of frame 105 may be coupled to a conductive interconnect and/or solder balls at various locations e.g. for grounding remaining portions of frame 105 in a packaged integrated circuit.

As shown in FIG. 10, the formation of interconnect layer 1001 allows for the increase in the pitch of balls 1015 with respect to the pitch of the die bond pads 1009.

Afterwards, encapsulated structure 900 is singulated to form packaged integrated circuits 1021, 1023, and 1025 along saw lines 1022 and 1024. In one embodiment, multiple die may be located in a packaged integrated circuit.

In the embodiments of FIGS. 1-10, all of the die of a carrier are moved in the same direction to abut and align to walls of a frame opening. However in other embodiments, the die may be moved in different directions.

Figure 11:
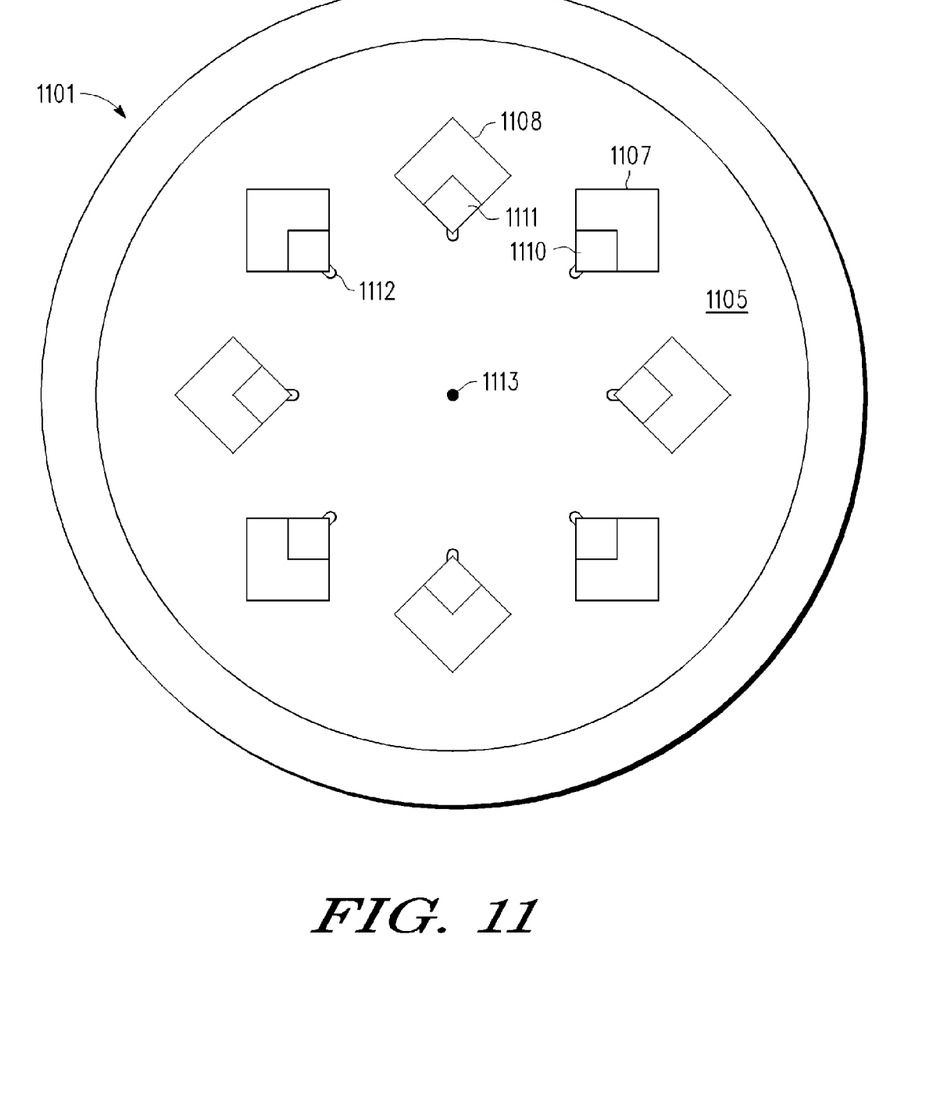
FIG. 11 is a top view of structures utilized in forming a plurality of packaged integrated circuits during one stage of manufacture according to another embodiment of the present invention.

For example, FIG. 11 shows an embodiment where the die 1111 have been moved radially inward towards the center 1113 of frame 1105. In the embodiment shown, each opening 1107 of frame 1105 is positioned such that the desired corner (the corners with relief aperture 1112) are positioned closest to the center 1113.

In one embodiment, to move each die 1110 radially inward, encapsulant is injected through a plurality of inlets (not shown) of an injecting fixture positioned around the perimeter of the carrier 1101 and pointed towards center 1113. An outlet hole would be located above the center 1113.

One advantage of moving the die to a corner closest to the center is that shrinkage of the encapsulant that results from cooling the encapsulant will not move the die further inward due to the frame restraining it.

In the embodiments above, positioning the die in a desired location of the frame is performed by moving the die with respect to the frame by an encapsulating process. One advantage that may occur from moving the die with the encapsulating process is that it may allow for a greater variation in die placement on a carrier with respect to frame location. However, in other embodiments, the die may be positioned in a corner of a frame opening by moving the frame with respect to the dies subsequent to the placement of the die.

Figure 12:
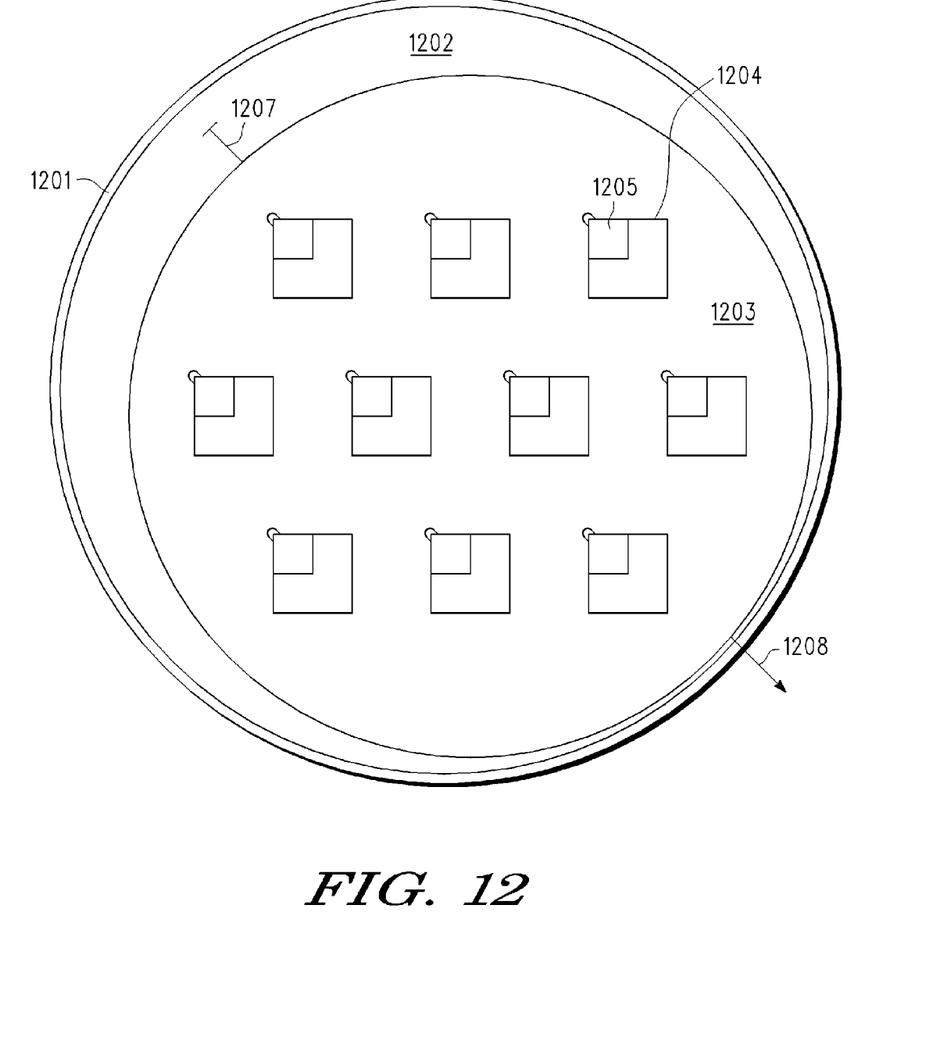
FIG. 12 is a top view of structures utilized in forming a plurality of packaged integrated circuits during one stage of manufacture according to another embodiment of the present invention.

FIG. 12 shows a top view of a carrier 1201, frame 1203, and die 1205 after frame 1203 has been moved in direction 1208 with respect to carrier 1201 and die 1205 to position the die in a corner of the openings 1204 of the frame such that two sides of the die abut and are aligned with two sides of the openings.

In one embodiment, moving the frame may be performed by first placing the frame over the adhesive structure 1202 but not contacting the adhesive structure 1202. The individual die would next be placed within the openings 1204 of the frame at center location. The adhesive would be heated and then the frame would be moved in direction 1208 by distance 1207 such that all of the die would located in a corner of the frame. Because the frame is moved, some (or all) of the die may be moved by the movement of the frame in that all of the die may not be completely centered. However, the frame may be moved by other methods in other embodiments. In other embodiments, the frame would be placed on the adhesive structure prior to moving the frame.

Positioning the die in a desired corner of a frame opening by moving the frame may advantageously reduce residual stress due to molding conditions by enabling the use of a less forceful encapsulation technique.

Positioning die of a structure in a corner of a frame opening such that the two adjacent edges of the die substantially abut and align with two sides of a frame opening may provide a way to more accurately align die with the frame. In some embodiments, it may also restrict movement of the die due to shrinkage of the encapsulant during curing. A more accurate placement of the die allows for a better alignment of the die bond pads with corresponding conductive structures (e.g. vias) of the interconnect layer (e.g. layer 1001).

In one embodiment, a method includes providing a support structure and placing a frame over the support structure. The support structure includes a plurality of openings therein and each opening of the plurality of openings has at least two walls. The method also includes placing each die of a plurality of die over the support structure. Each die of the plurality of die has at least two adjacent major edges. The relative placing of the frame and of each die of the plurality of die results in each die of the plurality of die being in an opening of the plurality of openings. The method also includes applying an encapsulant to the plurality of die and moving at least one of a group consisting of the plurality of die and the frame in relation to the other in a manner that causes two major adjacent edges of each die of the plurality of die to substantially abut to and align with two walls of an opening of the plurality of openings.

In another embodiment, a device includes an encapsulant covering a first side of a frame and a first side of a die. The frame has an opening. The die is in the opening. The frame has two walls substantially abutting and aligned with two edges of the die. The device further includes an interconnect layer contacting a second side of the die. The second side opposing the first side of the die.

In another embodiment, a method includes providing a support structure and placing a frame over the support structure. The support structure includes a plurality of openings therein and each opening of the plurality of openings has at least two walls. The method also includes placing each die of a plurality of die in an opening of the plurality of openings and applying an encapsulant over the plurality of die causing two major adjacent edges of each die of the plurality of die to substantially abut to and align with two walls of an opening of the plurality of openings in which the die is placed.

In another embodiment, a method includes providing a support structure and placing a frame over the support structure. The support structure includes a plurality of openings. The method also includes placing each die of a plurality of die over the support structure. The relative placing of the frame and of each die of the plurality of die results in each die of the plurality of die being in an opening of the plurality of openings. The method also includes applying an encapsulant to the plurality of die and moving at least one of a group consisting of the plurality of die and the frame in relation to the other in a manner that causes each die of the plurality of die to be located in a corner of an opening of the plurality of openings.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method, comprising:
providing a support structure;
placing a frame over the support structure, wherein the support structure includes a plurality of openings therein and each opening of the plurality of openings has at least two walls;
placing each die of a plurality of die over the support structure, wherein each die of the plurality of die has at least two adjacent major edges;
wherein the relative placing of the frame and of each die of the plurality of die results in each die of the plurality of die being in an opening of the plurality of openings;
applying an encapsulant to the plurality of die; and
moving at least one of a group consisting of the plurality of die and the frame in relation to the other in a manner that causes two major adjacent edges of each die of the plurality of die to substantially abut to and align with two walls of an opening of the plurality of openings;
wherein the step of moving is further characterized by occurring during the step of applying the encapsulant.

2. The method of claim 1, wherein the step of placing the frame is further characterized by the two walls of each opening of the plurality of openings being substantially orthogonal to each other and having a relief space located between the two walls.

3. The method of claim 1 wherein the step of applying the encapsulant is further characterized by directing a flow of the encapsulant in each opening of the plurality of openings in a direction, wherein surfaces of the two walls of an opening are positioned with respect to each other at an angle, the angle having an intersecting point, wherein the direction is generally in the direction towards the intersecting point of the angle for each opening of the plurality of openings.

4. The method of claim 3, wherein the step of applying the encapsulant is further characterized by the direction being radially inward toward a center of the frame.

5. The method of claim 3 wherein the step of applying the encapsulant is further characterized by the direction being generally uniform across the frame.

6. The method of claim 3, wherein the step of placing the frame is further characterized by each opening of the plurality of openings being rectangular and the relief space for each opening of the plurality of openings being at a corner where an extension of the two walls would intersect.

7. The method of claim 1, wherein the step of applying the encapsulant is further characterized by the encapsulant having sufficient viscosity to move each die of the plurality of die.

8. The method of claim 1 wherein the step of applying an encapsulant includes applying an encapsulant by a transfer molding encapsulation process.

9. The method of claim 1 wherein the step of applying an encapsulant includes applying an encapsulant by a screen printing process.

10. The method of claim 1, further comprising:
removing the support structure from the encapsulated die and frame to leave an encapsulated structure with a surface of each of the plurality of die exposed; and
forming an interconnect layer in contact with the plurality of exposed plurality of die.

11. The method of claim 10 further comprising:
singulating the encapsulated structure to form a plurality of packaged integrated circuits.

12. The method of claim 10, further comprising forming contact balls on the interconnect layer.

13. A method, comprising:
providing a support structure;
placing a frame over the support structure, wherein the support structure includes a plurality of openings therein and each opening of the plurality of openings has at least two walls;
placing each die of a plurality of die in an opening of the plurality of openings;
applying an encapsulant over the plurality of die causing two major adjacent edges of each die of the plurality of die to substantially abut to and align with two walls of an opening of the plurality of openings in which the each die is placed.

14. The method of claim 13, wherein the step of placing the frame is further characterized by each of the plurality of openings further characterized as having a relief space between the two walls.

15. The method of claim 14, wherein step of placing the frame is further characterized by each of the plurality of openings being substantially in the shape of a rectangle and the relief space has at least a portion outside the rectangle.

16. The method of claim 13, wherein the step of applying the encapsulant is further characterized by directing a flow of the encapsulant in a generally uniform direction over the support structure.

17. The method of claim 13 wherein the step of applying an encapsulant includes applying an encapsulant by a transfer molding encapsulation process.

18. The method of claim 13 wherein the step of applying an encapsulant includes applying an encapsulant by a screen printing process.

19. The method of claim 13 wherein the step of applying the encapsulant is further characterized by the encapsulant having sufficient viscosity to move each die of the plurality of die.

20. The method of claim 13, wherein the step of applying the encapsulant is further characterized by directing a flow of the encapsulant in each opening of the plurality of openings in a direction, wherein surfaces of the two walls of an opening are positioned with respect to each other at an angle, the angle having an intersecting point, wherein the direction is generally in the direction towards the intersecting point of the angle for each opening of the plurality of openings.

21. The method of claim 20, wherein the step of applying the encapsulant is further characterized by the direction being radially inward toward a center of the frame.

22. The method of claim 20 wherein the step of applying the encapsulant is further characterized by the direction being generally uniform across the frame.

23. The method of claim 20, wherein the step of placing the frame is further characterized by each opening of the plurality of openings being rectangular and the relief space for each opening of the plurality of openings being at a corner where an extension of the two walls would intersect.

* * * * *